(12) United States Patent
Bahnsen et al.

(10) Patent No.: US 11,980,001 B2
(45) Date of Patent: May 7, 2024

(54) COLLAPSIBLE SUPPORT FOR A COMPUTER CABINET, AND A COMPUTER COMPRISING A COLLAPSIBLE SUPPORT

(71) Applicant: SINDRI APS, Aarhus (DK)

(72) Inventors: Jonan Hjorslev Bahnsen, Brabrand (DK); Allan Sejer Ertner, Randers NV (DK)

(73) Assignee: SINDRI APS (DK)

( * ) Notice: Subject to any disclaimer, the term of this patent is extended or adjusted under 35 U.S.C. 154(b) by 99 days.

(21) Appl. No.: 17/775,001

(22) PCT Filed: Nov. 5, 2020

(86) PCT No.: PCT/EP2020/081113
§ 371 (c)(1),
(2) Date: May 6, 2022

(87) PCT Pub. No.: WO2021/089691
PCT Pub. Date: May 14, 2021

(65) Prior Publication Data
US 2022/0386493 A1    Dec. 1, 2022

(30) Foreign Application Priority Data
Nov. 8, 2019    (DK) .......................... PA 2019 01310

(51) Int. Cl.
*H05K 7/14*    (2006.01)
*F16M 11/04*    (2006.01)
(Continued)

(52) U.S. Cl.
CPC ............. *H05K 7/14* (2013.01); *F16M 11/041* (2013.01); *F16M 11/16* (2013.01); *H05K 5/0234* (2013.01)

(58) Field of Classification Search
CPC ...... H05K 7/14; H05K 5/0234; F16M 11/041; F16M 11/16; F16M 11/22; F16M 2200/028; A47B 3/002; G11B 33/02
(Continued)

(56) References Cited

U.S. PATENT DOCUMENTS 4,147,231 A * 4/1979 Chantler ................. E06C 7/423
                                                         182/172
5,395,086 A * 3/1995 Goldstein ............ F16M 11/041
                                                         248/346.03
(Continued)

FOREIGN PATENT DOCUMENTS

| CN | 207848860 A | 9/2018 |
| GB | 2 318 287 A | 4/1998 |
| WO | 2017/083713 A1 | 5/2017 |

OTHER PUBLICATIONS

Danish Patent and Trademark Office, Search Report, application No. PA 2019 01310, completed Apr. 24, 2020, 3 pages.
(Continued)

*Primary Examiner* — Muhammad Ijaz
(74) *Attorney, Agent, or Firm* — Ware, Fressola, Maguire & Barber LLP (57) ABSTRACT

A collapsible and adjustable support for a computer cabinet is shown. The collapsible support includes a first endpiece, a second endpiece, an elongated guide member connected to and spanning between the first and second endpieces, an elongated toothed rack spanning between the first and second endpieces, a first and a second leg, and a disengagement device adapted for sliding the toothed rack from a first position to a second position relative to the guide member. The guide member includes a first guide recess, and guide pin(s). The toothed rack includes one or more second guide recesses, each adapted for receiving a first guide pin of the guide member, thereby allowing the toothed rack to slide (Continued)

from the first position to the second position relative to the guide member. Each leg includes a foot, a leg part connected to the foot, and a sled connected to the leg part.

10 Claims, 12 Drawing Sheets

(51) Int. Cl.
   *F16M 11/16* (2006.01)
   *H05K 5/02* (2006.01)
(58) Field of Classification Search
   USPC .................................................... 248/346.01
   See application file for complete search history.

(56) References Cited

U.S. PATENT DOCUMENTS

| | | | | |
|---|---|---|---|---|
| 5,511,758 | A * | 4/1996 | Hsu | F16M 13/00 |
| | | | | 248/461 |
| 6,419,198 | B1 * | 7/2002 | Einav | F16M 11/38 |
| | | | | 248/346.03 |
| 7,252,350 | B2 * | 8/2007 | Chen | A47B 91/005 |
| | | | | 312/351.3 |
| 7,448,587 | B2 * | 11/2008 | Han | F16M 11/38 |
| | | | | 361/740 |
| 2015/0276121 | A1 * | 10/2015 | Max | A47B 23/043 |
| | | | | 248/462 |
| 2017/0362069 | A1 * | 12/2017 | Randall | B66F 1/04 |
| 2019/0060768 | A1 * | 2/2019 | Cragg | A45C 11/00 |
| 2019/0166240 | A1 * | 5/2019 | Hayahi | H05K 5/00 |

OTHER PUBLICATIONS

Bibliographic Data for CN207848860U including English Abstract, 1 page.
International Search Report (ISR), International Application No. PCT/EP2020/081113, dated Feb. 23, 2021, 3 pages.
Written Opinion of the International Searching Authority, International Application No. PCT/EP2020/081113, dated Feb. 23, 2021, 5 pages.

* cited by examiner

ID STAGE OF INTERNA# COLLAPSIBLE SUPPORT FOR A COMPUTER CABINET, AND A COMPUTER COMPRISING A COLLAPSIBLE SUPPORT

CROSS-REFERENCE TO RELATED APPLICATIONS

This application is the U.S. National Stage of International Application Number PCT/EP2020/081113 filed Nov. 5, 2020 and claims priority from Danish Application Number PA 2019 01310 filed Nov. 8, 2019.

BACKGROUND OF THE INVENTION

The present invention relates to computer cabinets. LAN Parties or Esports events are emerging sport disciplines, where the players can compete with real competitors and show off their powerful or fancy gaming rigs. These events often require that the players bring their own computer for participation. This means that portability is a major concern when building a gaming computer suitable for such events. The player will need a compact, strong, and lightweight computer case that is easy to carry and move around from one place to another. Furthermore, it needs to be easy to set up.

DESCRIPTION OF THE INVENTION

Hence, it is an object of the present invention to provide a computer suitable for LAN Parties or Esports events. To make the setup and packing routine easy, the inventors have developed a computer with a set of supports on each side of the cabinet, each with mechanized legs that are operated e.g. by the press of a button on a handle.

This is essential, as it allows the user to set everything up in a single action and precisely adjust the equipment with full control in a comfortable posture.

When the button is pressed, it releases a spring and a locking mechanism and forces the legs downwards, allowing the user to place it on the table while carrying a small fraction of the weight. As the legs move downwards, their angle is controlled by a guide recess in a guide member, that affects a sled in their top and forces their foot away from the cabinet to stabilize the cabinet in a vertical position. As the button is released, the locking mechanism (toothed rack and locking means on the sled) is re-activated and holds the cabinet in this position.

When the button is pressed yet again, the locking mechanism is released, and it is possible to force the cabinet downwards towards the table. When doing so, the sled of the front leg will push the sled of the back leg upwards and finally they both are in their starting position, being forced into place by the guide recess.

A first aspect relates to a collapsible support for a computer cabinet comprising:
  a first endpiece;
  a second endpiece;
  an elongated guide member connected to and spanning between said first and second endpieces; said guide member comprising a guide recess, and one or more guide pins;
  an elongated toothed rack spanning between said first and second endpieces; said toothed rack comprising one or more guide recesses, each adapted for receiving a guide pin of the guide member, thereby allowing said toothed rack to slide from a first position to a second position relative to said guide member;
  a first and a second leg, each comprising:
  a) a foot;
  b) a leg part connected to the foot; and
  c) a sled connected to the leg part; wherein said sled comprises i) a locking means adapted for engaging with said toothed rack, and ii) a guide pin adapted for engaging with the guide recess of the guide member, thereby allowing said sled and thereby said leg to move along said guide recess; and
  disengagement means adapted for sliding the toothed rack from said first position to said second position relative to said guide member.

A second aspect relates to a computer cabinet comprising a, preferably two, collapsible supports according to the present invention.

In one or more embodiments, the locking means comprises a row of teeth adapted for engaging with the toothed rack.

In one or more embodiments, the guide recess comprises a curved first part, a straight middle part, and a curved second part. Preferably, when the support is in its collapsed configuration, the guide pin of the second leg is positioned in the straight middle part of the guide recess, and the guide pin of the first leg is positioned in the curved first part of the guide recess; and when the support is in its unfolded configuration, the guide pin of the second leg is positioned in the curved second part of the guide recess, and the guide pin of the first leg is positioned in the straight middle part of the guide recess.

In one or more embodiments, the position of the guide pin relative to the leg part, and the shape or path of the guide recess is configured to ensure that the leg part will tilt relative to the guide member when the sled move from the first end of the guide recess and towards the opposing end of said guide recess.

In one or more embodiments, the disengagement means comprises a lever arm connected to the toothed rack at one end, and to a push button mechanism at the other end. When pressing the push button mechanism, the lever arm pulls in the toothed rack that thereby slides from said first position to said second position relative to said guide member.

In one or more embodiments, the support further comprises push means adapted for advancing the sleds in the direction of the opposite end of the guide recess. The push means may be spring actuated.

A third aspect relates to a computer comprising:
  a cabinet; and
  a collapsible support according to the present invention.

In one or more embodiments, the computer further comprises:
  a display screen; and
  a casing adapted for supporting a computer screen;
  wherein two supports are flanking said casing, one on each side.

In one or more embodiments, the support is configured as a handle. This configuration allows the user to lift the computer by both hands. Preferably, the disengagement means may be activated in the handle, e.g. by a push button mechanism.

It should be noted that embodiments and features described in the context of one of the aspects of the present invention also apply to the other aspects of the invention.

As used in the specification and the appended claims, the singular forms "a", "an", and "the" include plural referents unless the context clearly dictates otherwise. Ranges may be expressed herein as from "about" or "approximately" one particular value and/or to "about" or "approximately"

another particular value. When such a range is expressed, another embodiment includes from the one particular value and/or to the other particular value. Similarly, when values are expressed as approximations, by use of the antecedent "about", it will be understood that the particular value forms another embodiment.

DETAILED DESCRIPTION OF THE INVENTION

Figure 1:
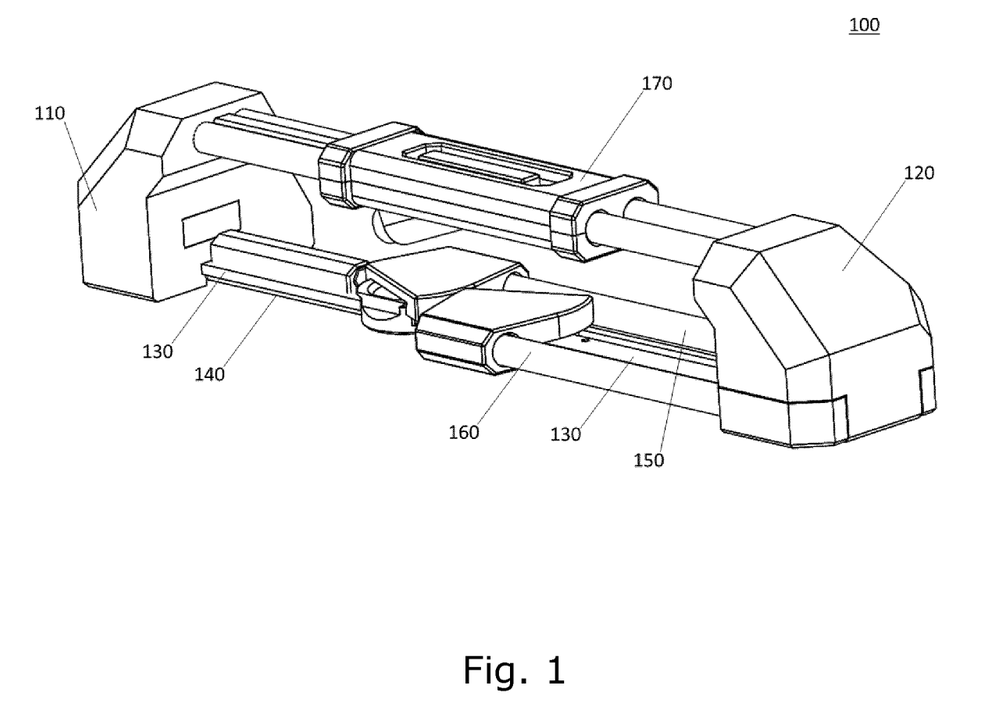
FIG. 1 shows a support according to the invention in a collapsed configuration.
Figure 10:
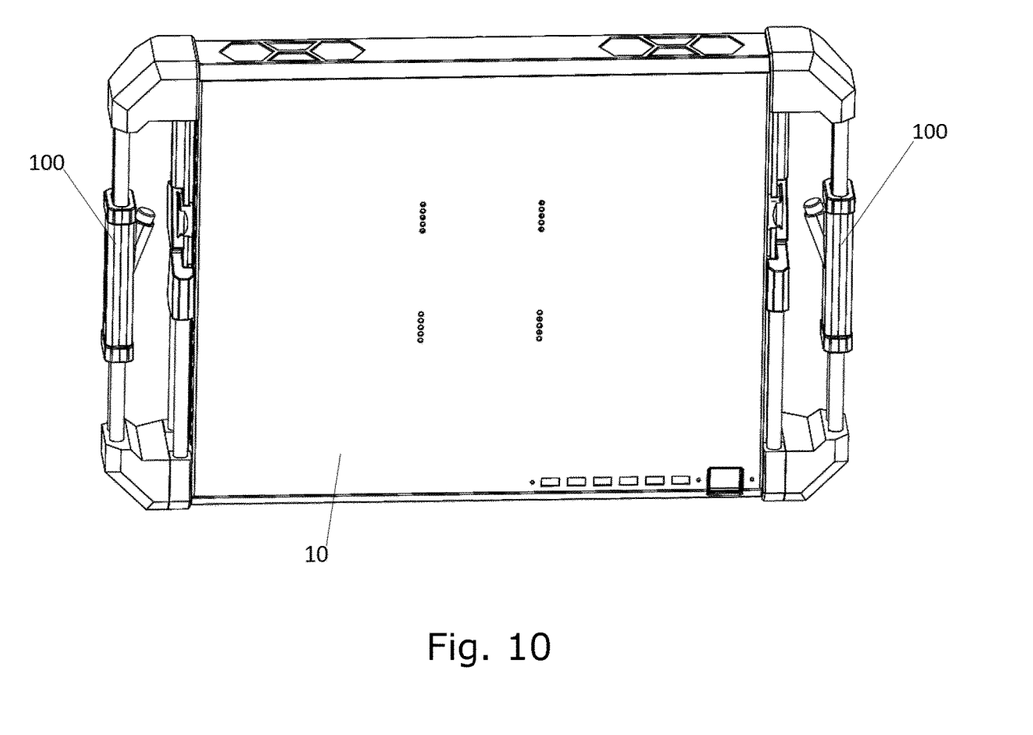
FIG. 10 shows a front view of a computer cabinet with two supports mounted thereto.
Figure 11:
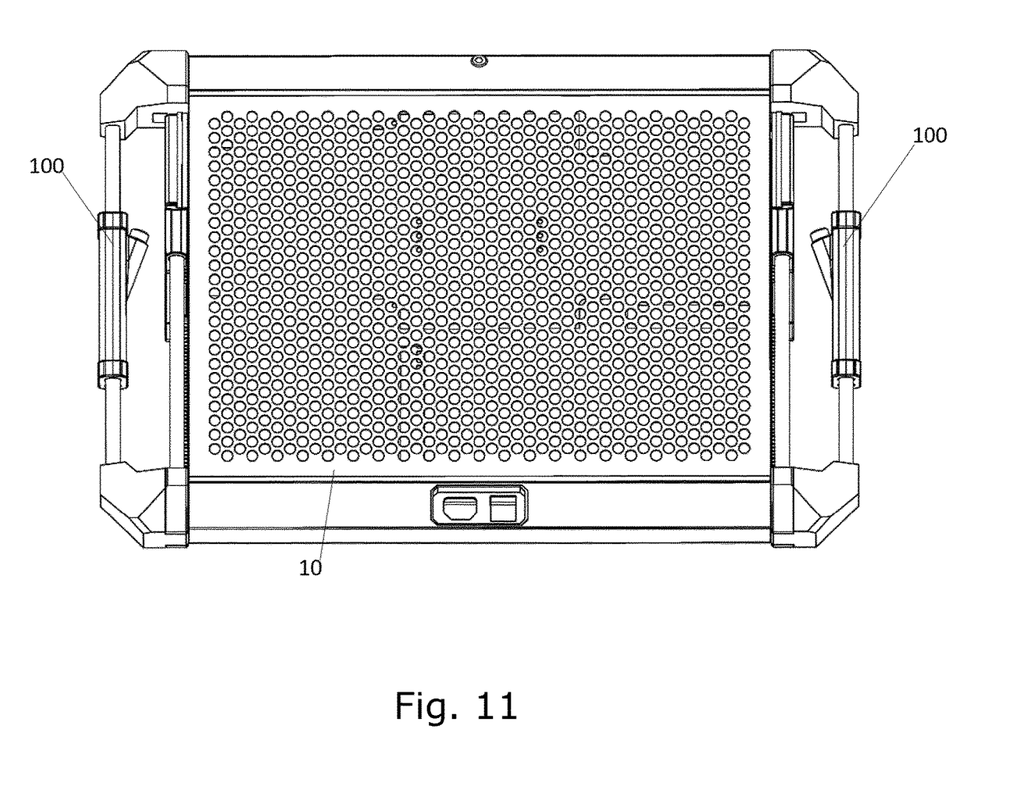
FIG. 11 shows a back view of a computer cabinet with two supports mounted thereto.
Figure 12:
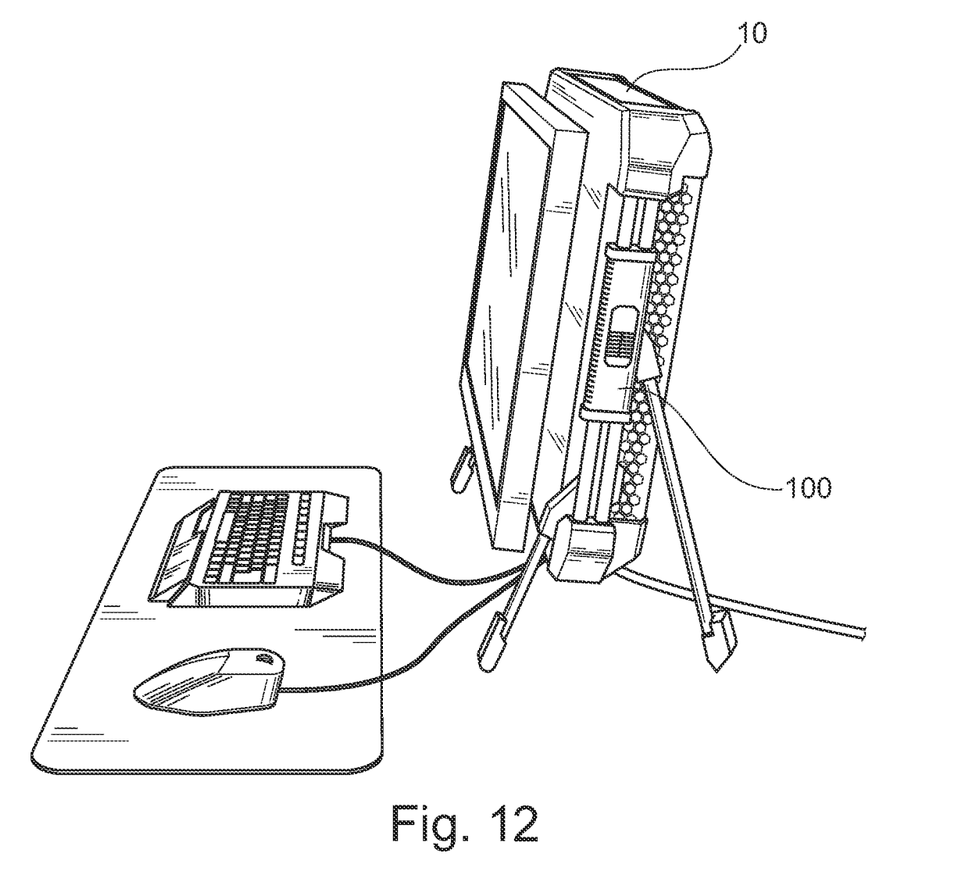
FIG. 12 shows a side view of a computer with two supports flanking the cabinet.

In FIG. 1, an exemplary support 100 for a computer cabinet according to the present invention is shown. Two supports 100 should preferably be used with a computer cabinet 10, as exemplified in FIGS. 10-12.

Figure 2:
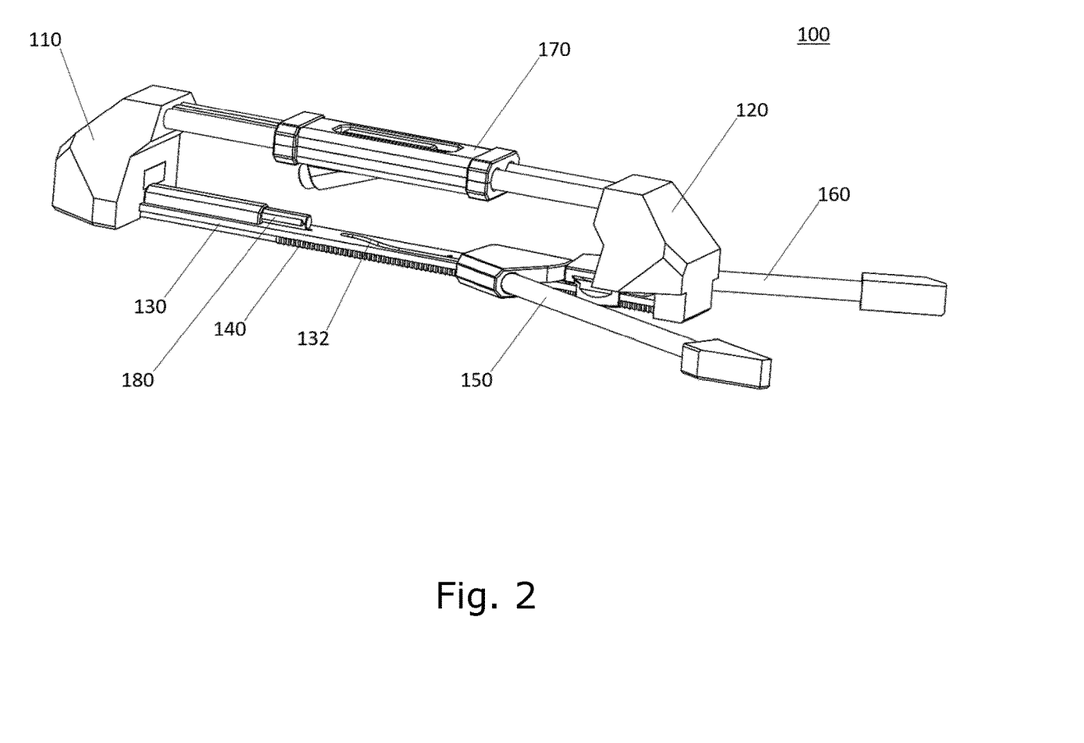
FIG. 2 shows a support according to the invention in an unfolded configuration.

In FIG. 1, the support 100 is shown collapsed and comprising a first endpiece 110, a second endpiece 120, an elongated guide member 130 connected to and spanning between the first 110 and second 120 endpieces, an elongated toothed rack 140 spanning the first 110 and second 120 endpieces, a first 150 and a second 160 leg, and a disengagement means 170. FIG. 2 shows the support in the unfolded configuration.

Figure 3:
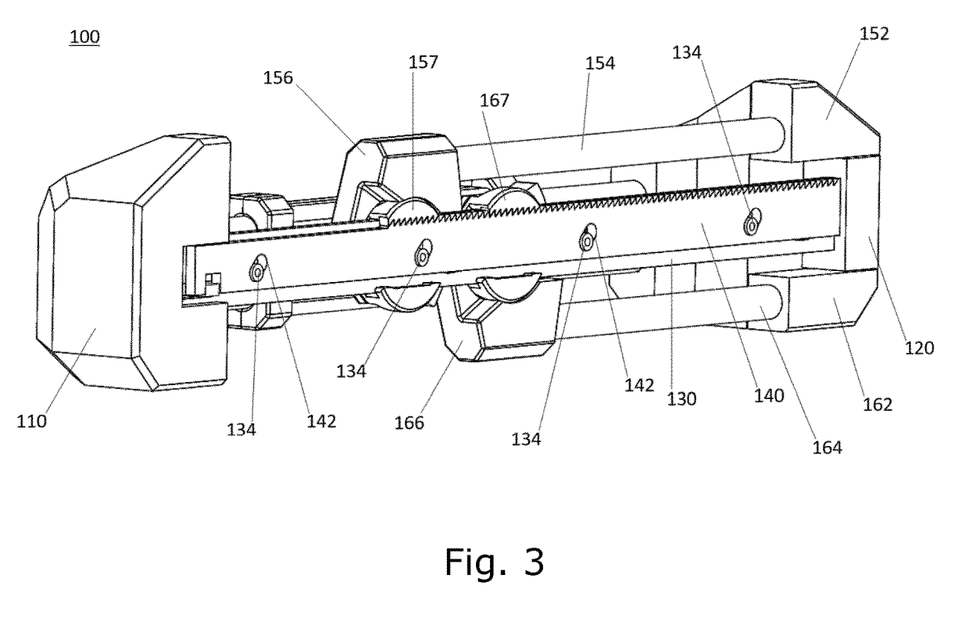
FIG. 3 shows a perspective view of a support according to the invention in a collapsed configuration.
Figure 9:
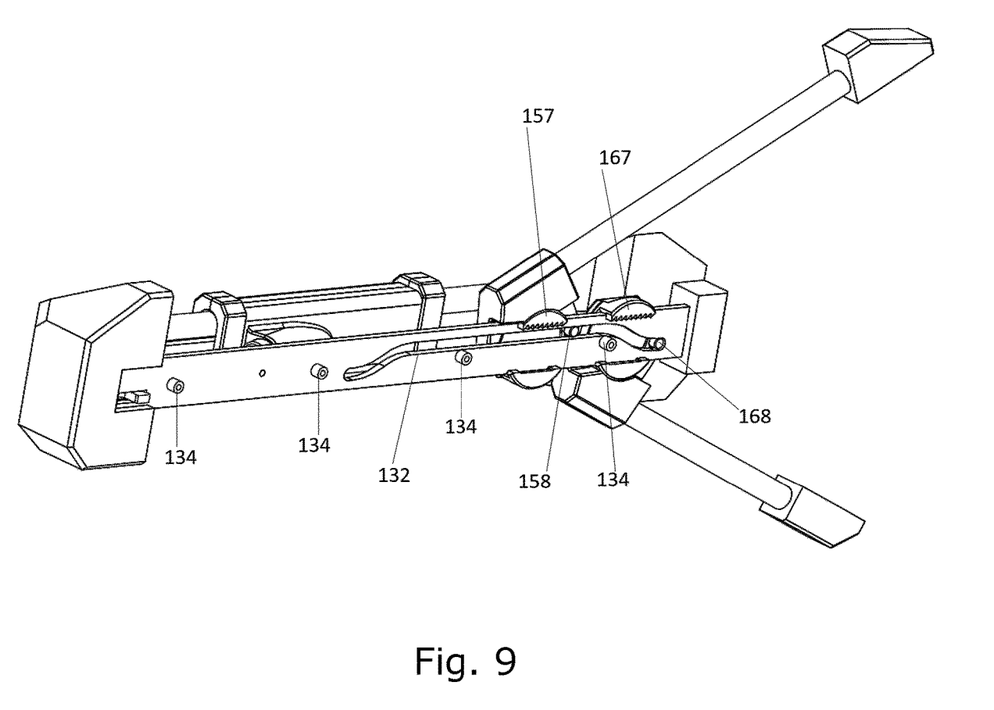
FIG. 9 shows a perspective view of a support according to the invention in an unfolded configuration, where the toothed rack has been removed.

FIG. 3 shows a perspective view of a support according to the invention in a collapsed configuration, and from the side suitable for connection to a computer cabinet. The guide member 130 is shown comprising four guide pins 134, and also comprises a guide recess 132 that can only be seen in FIGS. 2 and 9. The toothed rack 140 comprises four guide recesses 142, each adapted for receiving a guide pin 134 of the guide member 130, thereby allowing the toothed rack 140 to slide/displace from a first position to a second position relative to said guide member 130. This operation is crucial for the support to be able to move its legs 150, 160 from a collapsed configuration to an unfolded configuration.

Figure 7:
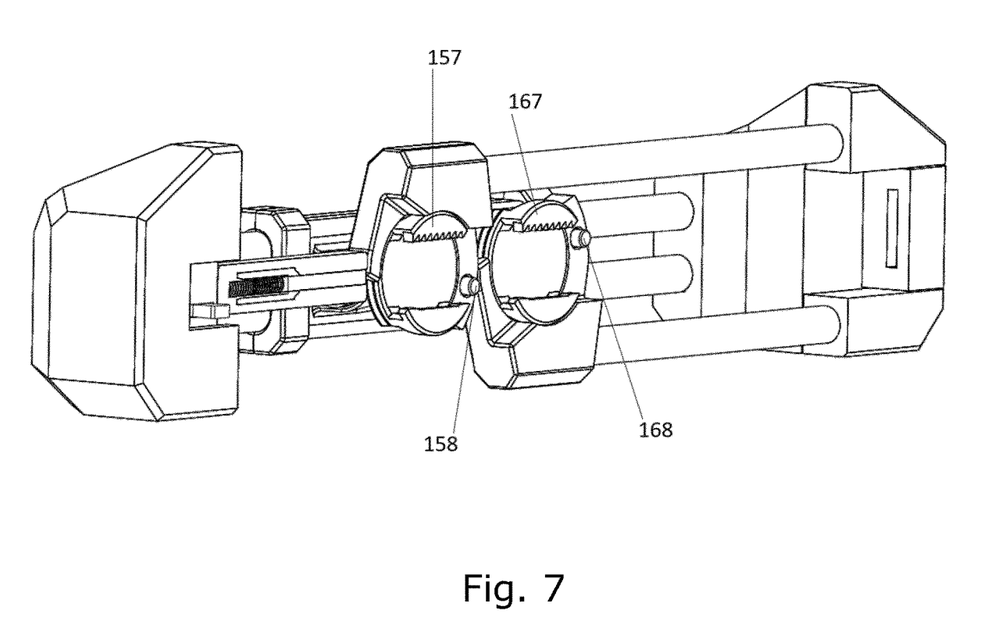
FIG. 7 shows a perspective view of a support according to the invention in a collapsed configuration, where the guide member and toothed rack have been removed.
Figure 8:
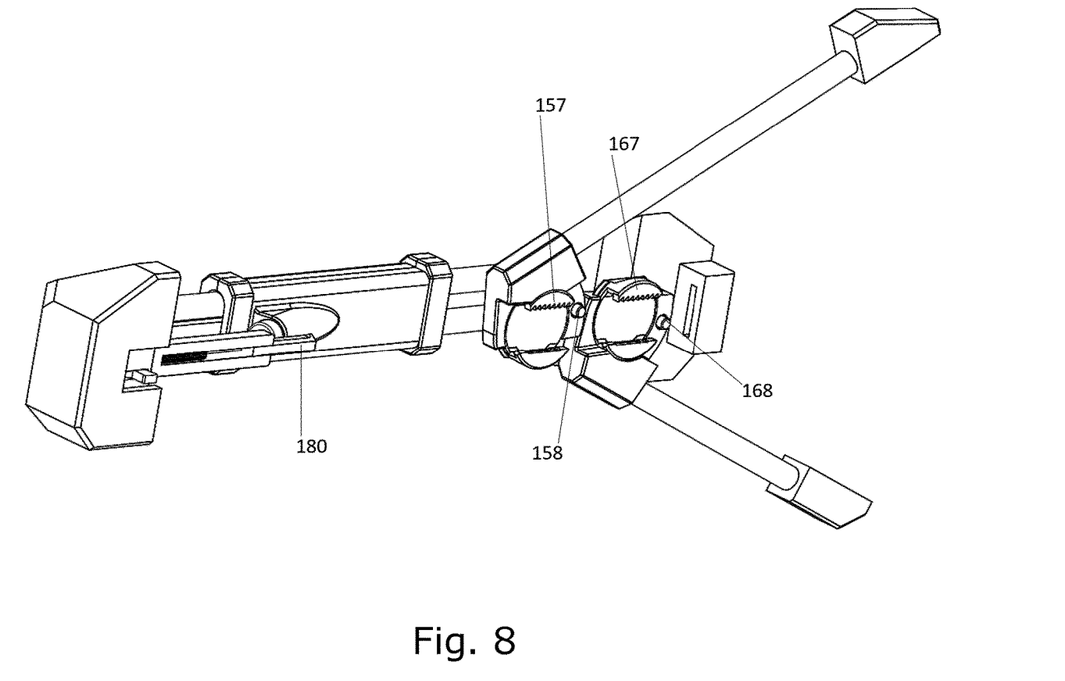
FIG. 8 shows a perspective view of a support according to the invention in an unfolded configuration, where the guide member and toothed rack have been removed.

Each leg 150, 160 comprises a foot 152, 162, a leg part 154, 164 connected to the foot 152, 162, and a sled 156, 166 connected to the leg part 154, 164. The sled 156, 166 comprises a locking means 157, 167 adapted for engaging with the toothed rack 140. Here, the locking means is shown comprising a row of teeth adapted for engaging with the toothed rack 140. The sleds 156, 166 also comprise a guide pin 158, 168 (FIGS. 7 and 8) adapted for engaging with the guide recess 132 of the guide member 130, thereby allowing said sleds 156, 166 and thereby the legs 150, 160 to move along said guide recess 132. The position of the guide pin 158, 168 relative to the leg part 154, 164, and the shape or path of the guide recess 132 (see e.g. FIG. 9) ensures that the leg 150, 160 will tilt relative to the guide member 130 when the sleds 156, 166 move from the first end of the guide recess and towards the opposing end of said guide recess 132. When the toothed rack 140 is in the first position relative to the guide member 130, it engages with the sleds 156, 166; and when the toothed rack 140 is in the second position relative to the guide member 130, it disengages from the sleds 156, 166, thereby allowing them to slide along said guide recess 132. When the support 100 is in its collapsed configuration, the sleds 156, 166 will be positioned at one end of the guide recess 132; and when the support 100 is in its unfolded configuration, the sleds 156, 166 will be positioned at the opposite end of the guide recess 132. However, the support 100 can also be used in positions, where the sleds 156, 166 are placed at positions between the two ends. In these situations, the leg parts 154, 164 will have a different angle relative to the guide member 130 than when the sleds 156, 166 are placed at the opposite end of the guide recess 132. Hence, the support's 100 position relative to e.g. a table surface may be varied. The support 100 may comprise a spring actuated push means 180 (FIGS. 2 and 8) adapted for advancing the sleds 156, 166 in the direction of the opposite end of the guide recess 132.

Figure 4:
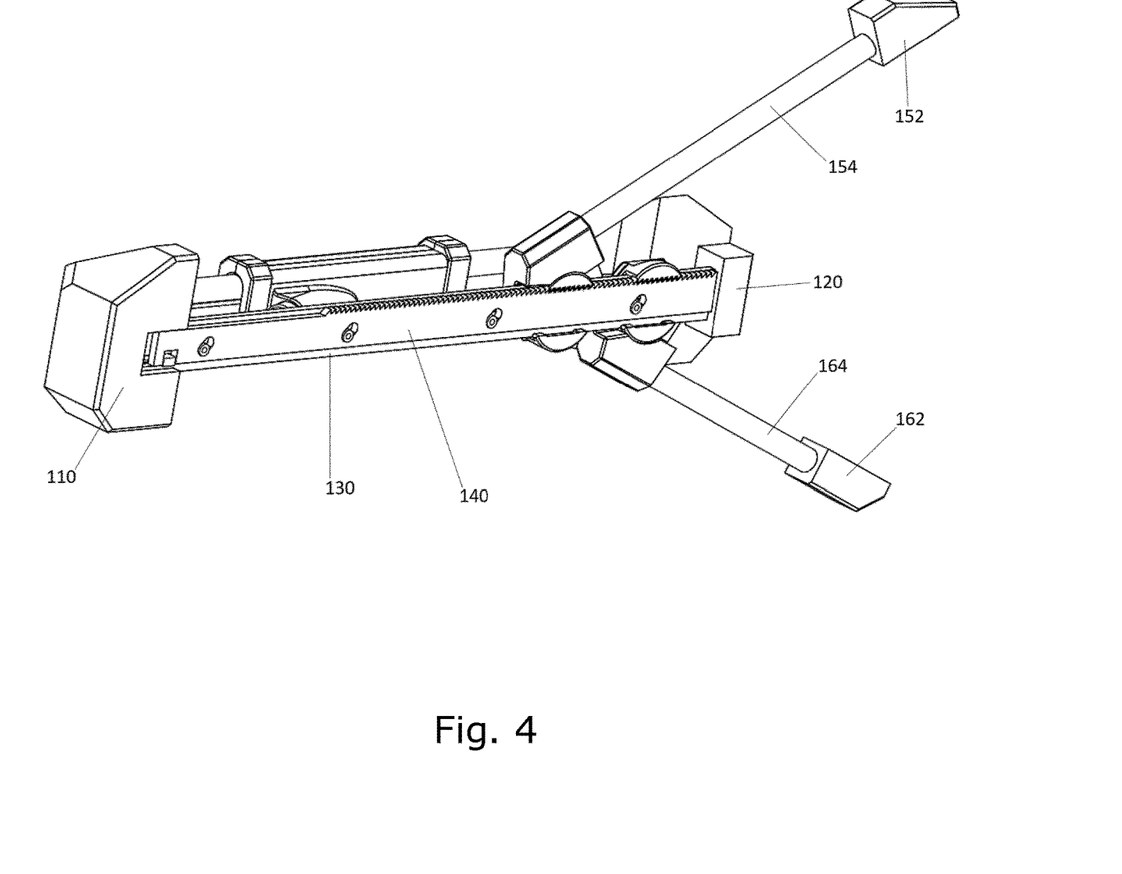
FIG. 4 shows a perspective view of a support according to the invention in an unfolded configuration.

FIG. 4 shows a perspective view of a support according to the invention in an unfolded configuration, and from the side suitable for connection to a computer cabinet.

Figure 5:
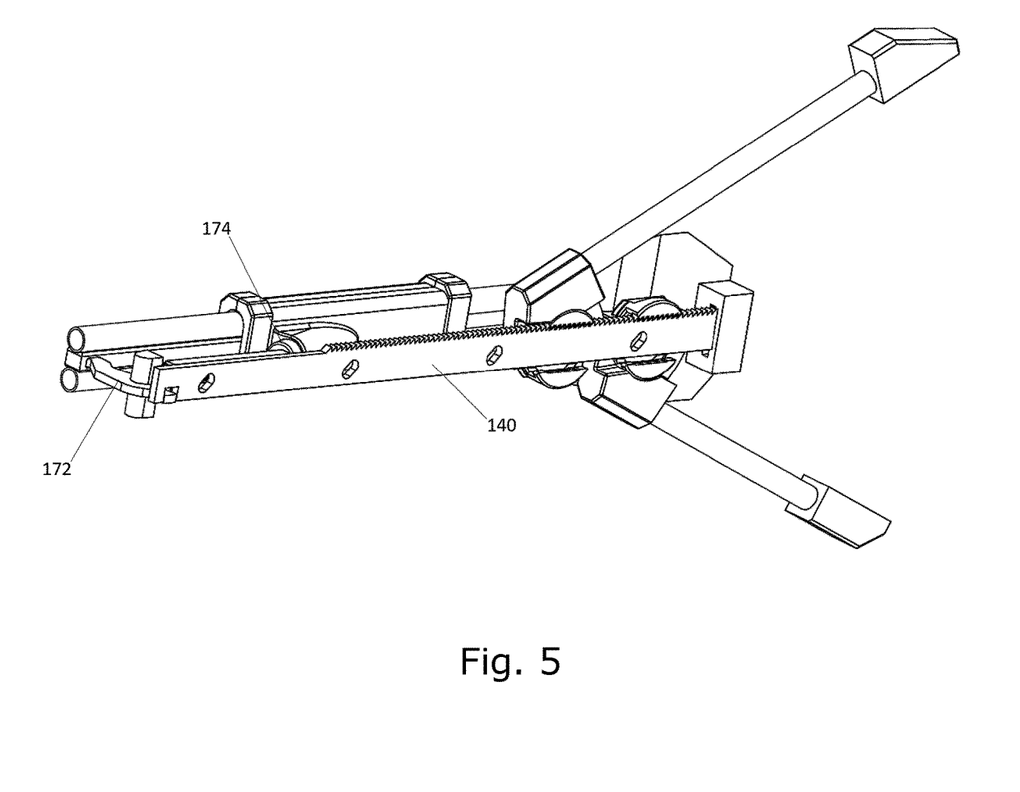
FIG. 5 shows a perspective view of a support according to the invention in an unfolded configuration, where parts have been removed to reveal the disengagement means.
Figure 6:
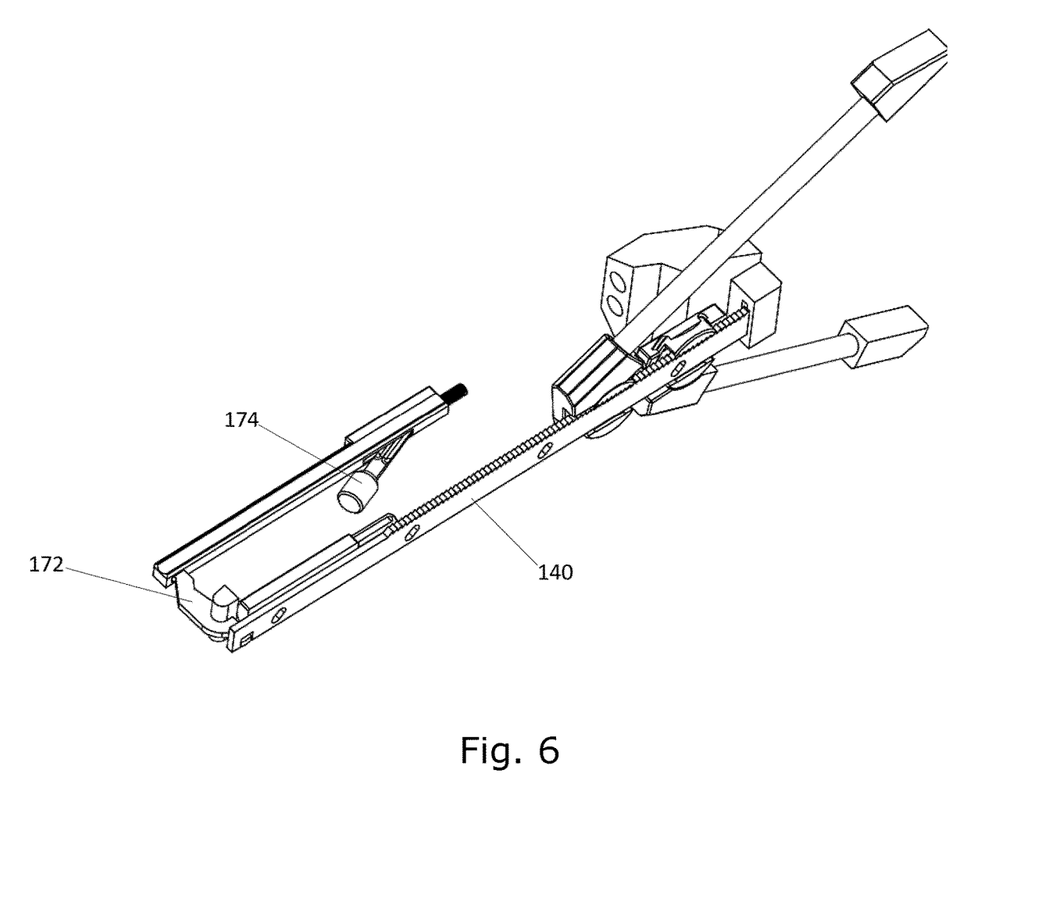
FIG. 6 shows a perspective view of a support according to the invention in an unfolded configuration, where parts have been removed to reveal the disengagement means.

In FIGS. 5 and 6 parts of the support 100 have been removed to reveal the disengagement means 170 adapted for sliding the toothed rack 140 from said first position to said second position relative to said guide member 130. This embodiment is not intended to be limiting for the scope of the invention and is merely an example of how it could be configured. The disengagement means comprises a lever arm 172 connected to the toothed rack 140 at one end, and to a push button mechanism 174 at the other end. When pressing the push button mechanism 174, the lever arm pulls in the toothed rack 140 that thereby slides from said first position to said second position relative to said guide member 130.

REFERENCES

10 Computer cabinet
100 Support
110 First endpiece
120 Second endpiece
130 Guide member
132 Guide recess
134 Guide pin
140 Toothed rack
142 Guide recess
150 First leg
152 Foot
154 Leg part 156 Sled
157 Locking means
158 Guide pin
160 Second leg
162 Foot
164 Leg part
166 Sled
167 Locking means
168 Guide pin
170 Disengagement means
172 Lever arm
174 Push button mechanism
180 Push means

The invention claimed is:

1. A collapsible support (100) for a computer cabinet (10) comprising:
   a first endpiece (110);
   a second endpiece (120);
   an elongated guide member (130) connected to and spanning between said first endpiece (110) and said second endpiece (120); said guide member (130) comprising a first guide recess (132), and one or more first guide pins (134);
   an elongated toothed rack (140) spanning between said first endpiece (110) and said second endpiece (120); said toothed rack (140) comprising one or more second guide recesses (142), each adapted for receiving a first guide pin (134) of the guide member (130), thereby allowing said toothed rack (140) to slide from a first position to a second position relative to said guide member (130);
   a first leg (150) and a second leg (160), each comprising:
   a) a foot (152, 162);
   b) a leg part (154, 164) connected to the foot (152, 162); and
   c) a sled (156, 166) connected to the leg part (154, 164); wherein said sled (156, 166) comprises i) a locking means (157, 167) adapted for engaging with said toothed rack (140), and ii) a second guide pin (158, 168) adapted for engaging with the first guide recess (132) of the guide member (130), thereby allowing said sled (156, 166) and thereby said leg (150, 160) to move along said first guide recess (132); and
   disengagement means (170) adapted for sliding the toothed rack (140) from said first position to said second position relative to said guide member (130).

2. The support (100) according to claim 1, wherein the locking means (157, 167) comprises a row of teeth adapted for engaging with the toothed rack (140).

3. The support (100) according to claim 1, wherein the first guide recess (132) comprises a curved first part, a straight middle part, and a curved second part.

4. The support (100) according to claim 1, wherein a position of the second guide pin (158, 168) relative to the leg part (154, 164), and a shape or path of the first guide recess (132) ensures that the leg part (154, 164) will tilt relative to the guide member (130) when the sled (156, 166) moves from a first end of the first guide recess (132) and towards an opposing second end of said first guide recess (132).

5. The support (100) according to claim 1, wherein the disengagement means (170) comprises a lever arm (172) connected to the toothed rack (140) at one end, and to a push button mechanism (174) at another end.

6. The support (100) according to claim 1, further comprising push means (180) adapted for advancing the sled (156, 166) in a direction toward an end of the first guide recess (132).

7. The support (100) according to claim 6, wherein the push means (180) is spring actuated.

8. An apparatus comprising:
   a cabinet (10); and
   a collapsible support (100) comprising:
   a first endpiece (110);
   a second endpiece (120);
   an elongated guide member (130) connected to and spanning between said first endpiece (110) and said second endpiece (120); said guide member (130) comprising a first guide recess (132), and one or more first guide pins (134);
   an elongated toothed rack (140) spanning between said first endpiece (110) and said second endpiece (120); said toothed rack (140) comprising one or more second guide recesses (142), each adapted for receiving a first guide pin (134) of the guide member (130), thereby allowing said toothed rack (140) to slide from a first position to a second position relative to said guide member (130);
   a first leg (150) and a second leg (160), each comprising:
   a) a foot (152, 162);
   b) a leg part (154, 164) connected to the foot (152, 162); and
   c) a sled (156, 166) connected to the leg part (154, 164); wherein said sled (156, 166) comprises i) a locking means (157, 167) adapted for engaging with said toothed rack (140), and ii) a second guide pin (158, 168) adapted for engaging with the first guide recess (132) of the guide member (130), thereby allowing said sled (156, 166) and thereby said leg (150, 160) to move along said first guide recess (132); and
   disengagement means (170) adapted for sliding the toothed rack (140) from said first position to said second position relative to said guide member (130).

9. The apparatus according to claim 8, further comprising:
   a display screen; and
   a casing adapted for supporting a computer screen;
   wherein two supports (100) are flanking said casing, one on each side.

10. An apparatus, comprising:
    a cabinet (10); and
    a collapsible support (100) for the cabinet (10) comprising:
    a first endpiece (110);
    a second endpiece (120);
    an elongated guide member (130) connected to and spanning between said first endpiece (110) and said second endpiece (120); said guide member (130) comprising a first guide recess (132), and one or more first guide pins (134);
    an elongated toothed rack (140) spanning between said first endpiece (110) and said second endpiece (120); said toothed rack (140) comprising one or more second guide recesses (142), each adapted for receiving a first guide pin (134) of the guide member (130), thereby allowing said toothed rack (140) to slide from a first position to a second position relative to said guide member (130);
    a first leg (150) and a second leg (160), each comprising:
    a) a foot (152, 162);
    b) a leg part (154, 164) connected to the foot (152, 162); and
    c) a sled (156, 166) connected to the leg part (154, 164); wherein said sled (156, 166) comprises i) a locking means (157, 167) adapted for engaging with said toothed rack (140), and ii) a second guide pin (158, 168) adapted for engaging with the first guide recess (132) of the guide member (130), thereby allowing said sled (156, 166) and thereby said leg (150, 160) to move along said first guide recess (132); and disengagement means (170) adapted for sliding the toothed rack (140) from said first position to said second position relative to said guide member (130), wherein the collapsible support (100) is configured as a handle.

* * * * *